(12) United States Patent
Yamada

(10) Patent No.: US 9,812,894 B2
(45) Date of Patent: Nov. 7, 2017

(54) POWER SWITCHING CIRCUIT, SEMICONDUCTOR INTEGRATED CIRCUIT, RADIO APPARATUS, RADIO SYSTEM, AND POWER SWITCHING METHOD

(71) Applicant: FUJITSU SEMICONDUCTOR LIMITED, Yokohama-shi, Kanagawa (JP)

(72) Inventor: Satoshi Yamada, Kawasaki (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 416 days.

(21) Appl. No.: 14/658,946

(22) Filed: Mar. 16, 2015

(65) Prior Publication Data

US 2015/0303743 A1    Oct. 22, 2015

(30) Foreign Application Priority Data

Apr. 18, 2014 (JP) ................. 2014-086626

(51) Int. Cl.
| | | |
|---|---|---|
| H05K 7/14 | (2006.01) | |
| H02J 7/04 | (2006.01) | |
| G01R 31/40 | (2014.01) | |
| G01R 19/00 | (2006.01) | |
| H02J 7/02 | (2016.01) | |
| H02J 50/10 | (2016.01) | |

(52) U.S. Cl.
CPC .......... *H02J 7/045* (2013.01); *G01R 19/0038* (2013.01); *G01R 31/40* (2013.01); *G01R 19/0092* (2013.01); *H02J 7/025* (2013.01); *H02J 50/10* (2016.02)

(58) Field of Classification Search
None
See application file for complete search history.

(56) References Cited

U.S. PATENT DOCUMENTS 6,459,175 B1 * 10/2002 Potega ................. B60L 11/185
307/132 M
2011/0127840 A1    6/2011 Chang et al.
2014/0057575 A1 *  2/2014 Ayukawa ................. G05F 1/10
455/73

FOREIGN PATENT DOCUMENTS

| CN | 1746806 A | 3/2006 |
|---|---|---|
| CN | 102082461 A | 6/2011 |
| JP | 2001-69272 A | 3/2001 |
| JP | 2005-80491 A | 3/2005 |
| JP | 2005-101696 A | 4/2005 |
| JP | 2008-125176 A | 5/2008 |

OTHER PUBLICATIONS

Chinese Office Action of related Chinese Patent Application No. 201510135145.7 dated Jun. 26, 2017.

* cited by examiner

*Primary Examiner* — Cassandra Cox
(74) *Attorney, Agent, or Firm* — Arent Fox LLP

(57) ABSTRACT

A power switching circuit includes a current mirror circuit to generate mirror currents, by transferring, at different mirror ratios, monitored currents that are obtained by monitoring power supply voltages, a selector to select the mirror currents with a combination having the different mirror ratios for the monitored currents, according to a switching state of the power supply voltages, a comparator to compare the mirror currents selected by the selector and output a comparison result, and a switching circuit to switch a supply voltage to be supplied to a load to one of the power supply voltages, based on the comparison result.

14 Claims, 6 Drawing Sheets

US 9,812,894 B2

POWER SWITCHING CIRCUIT, SEMICONDUCTOR INTEGRATED CIRCUIT, RADIO APPARATUS, RADIO SYSTEM, AND POWER SWITCHING METHOD

CROSS-REFERENCE TO RELATED APPLICATIONS

This application is based upon and claims the benefit of priority of the prior Japanese Patent Application No. 2014-086626, filed on Apr. 18, 2014, the entire contents of which are incorporated herein by reference.

FIELD

The embodiments discussed herein are related to a power switching circuit, a semiconductor integrated circuit, a radio apparatus, a radio system, and a power switching method.

BACKGROUND

Conventionally, a known power switching circuit switches the power by comparing a voltage from a first power supply and a voltage from a second power supply, as proposed in Japanese Laid-Open Patent Publication No. 2008-125176, for example.

A chattering in which the switching of the power supplies is repeated may occur when voltage values of the voltages from the power supplies remain approximately the same. However, when the voltages that are compared are obtained from the power supplies via respective resistor voltage dividers, an amount of change in each voltage-divided voltage is small compared to an amount of change in the corresponding power supply voltage. For this reason, in a case in which a detection accuracy of the voltage-divided voltages becomes inconsistent, the switching of the power supplies may not be stable.

For example, in an IC (Integrated Circuit) tag having a low power consumption and a small circuit area, the power consumption of resistors in the resistor voltage divider and the circuit area may affect communication performance and cost of the IC tag.

SUMMARY

Accordingly, it is an object in one aspect of the embodiments to provide a power switching circuit, a semiconductor integrated circuit, a radio apparatus, a radio system, and a power switching method, capable of stabilizing power switching.

According to one aspect of the embodiments, a power switching circuit includes a current mirror circuit configured to generate a plurality of mirror currents, by transferring, at different mirror ratios, a plurality of monitored currents that are obtained by monitoring a plurality of power supply voltages; a selector configured to select the plurality of mirror currents with a combination having the different mirror ratios for the plurality of monitored currents, according to a switching state of the plurality of power supply voltages; a comparator configured to compare the plurality of mirror currents selected by the selector, and output a comparison result; and a switching circuit configured to switch a supply voltage to be supplied to a load to one of the plurality of power supply voltages, based on the comparison result.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be described with reference to the accompanying drawings.

A description will now be given of the power switching circuit, the semiconductor integrated circuit, the radio apparatus, the radio system, and the power switching method in each embodiment according to the present invention.

Figure 1:
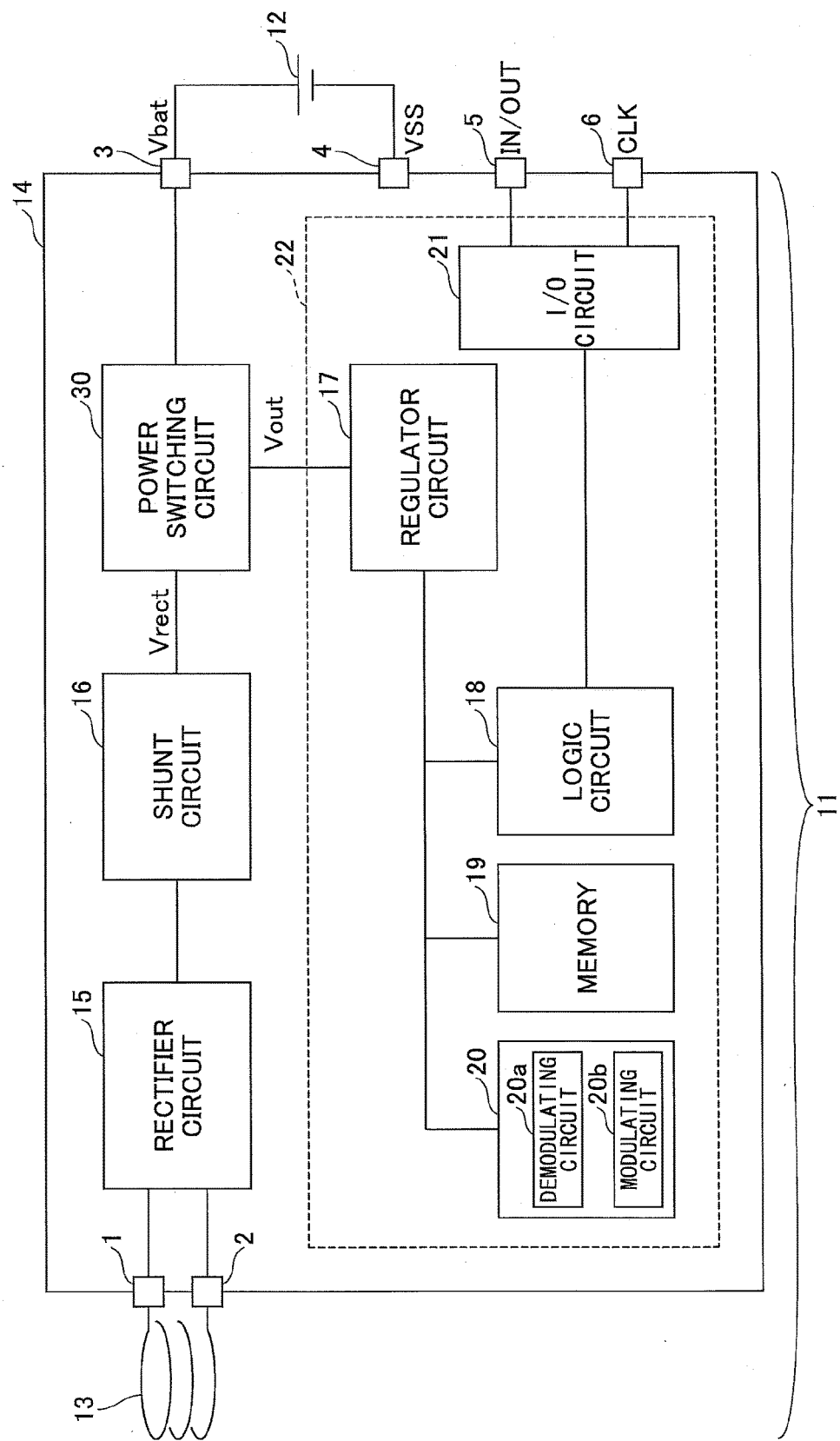
FIG. 1 is a block diagram illustrating a configuration of an example of a radio system and a radio apparatus.

FIG. 1 is a block diagram illustrating a configuration of an example of the radio system and the radio apparatus. FIG. 1 illustrates the configuration of an example of a communication system 10 and an IC (Integrated Circuit) tag 11. The communication system 10 is an example of the radio system, and includes an antenna 13, a battery 12, and a semiconductor integrated circuit 14. The IC tag 11 is an example of the radio apparatus, and includes the antenna 13 and the semiconductor integrated circuit 14. The antenna 13 may be formed by a coil, for example, and the semiconductor integrated circuit 14 may be formed by an LSI (Large Scale Integrated circuit), for example.

The IC tag 11 is an electronic device that performs a contactless communication with an external apparatus, such as a reader and writer, via the antenna 13. The semiconductor integrated circuit 14 includes an internal circuit 22 having a function to perform a contactless communication with the external apparatus, such as the reader and writer, via the antenna 13.

The internal circuit 22 may include a function to perform a communication (for example, a function to perform a contact communication, such as a cable serial communication) with an electronic apparatus, such as a home appliance. In a case in which the internal circuit 22 includes the function communicable with the electronic apparatus, such as the home appliance, the IC tag 11 may be built into the electronic apparatus, so that an operation of the electronic apparatus, such as the home appliance, becomes controllable from an external apparatus (for example, a smartphone), such as the reader and writer. In this case, information of the electronic apparatus, such as the home appliance, can be read from the external apparatus, such as the reader and writer.

The internal circuit 22 is an example of an electronic circuit, and includes a regulator circuit 17, a modulating and demodulating circuit 20, a memory 19, a logic circuit 18, and an I/O (Input and Output) circuit 21. The internal circuit 22 is also an example of a load that operates when supplied with an output voltage Vout of a power switching circuit 30. The modulating and demodulating circuit 20, the memory 19, the logic circuit 18, and the I/O circuit 21 can operate stably based on a constant voltage that is generated from the regulator circuit 17 that regulates the output voltage Vout, even when the output voltage Vout varies.

The modulating and demodulating circuit 20 includes a demodulating circuit 20a that demodulates radio waves received by the antenna 13, and a modulating circuit 20b that modulates radio waves to be transmitted from the antenna 13. For example, the demodulating circuit 20a obtains a reception command from the radio waves received by the antenna 13. The modulating circuit 20b causes a transmission command processed by the logic circuit 18 to be carried on the radio waves to be transmitted from the antenna 13.

The logic circuit 18 stores data in the memory 19, and outputs signals to an external circuit of the semiconductor integrated circuit 14 via the I/O circuit 21, according to the reception command obtained by the demodulating circuit 20a. In addition, the logic circuit 18 generates the transmission command to be transmitted from the antenna 13, based on signals input from the external circuit of the semiconductor integrated circuit 14 via the I/O circuit 21. For example, the external circuit of the semiconductor integrated circuit 14 may be a microcomputer built into the electronic apparatus, such as the home appliance.

The I/O circuit 21 performs a cable serial communication with an external circuit that is connected to an input and output terminal 5 and a clock terminal 6, according to a synchronous serial communication standard, for example. Examples of the synchronous serial communication standard includes I2C (Inter-integrated Circuit), SPI (Serial Peripheral Interface), or the like. The input and output terminal 5 may be an IN/OUT terminal of the semiconductor integrated circuit 14, used for inputting signals to and outputting signals from the semiconductor integrated circuit 14. The clock terminal 6 may be a CLK terminal of the semiconductor integrated circuit 14, used for inputting a clock signal for signal synchronization to and outputting the clock signal from the semiconductor integrated circuit 14.

The semiconductor integrated circuit 14 includes antenna terminals 1 and 2 that connect to the antenna 13, a rectifier circuit 15, a shunt circuit 16, and a power switching circuitry 30.

The rectifier circuit 15 rectifies and converts an A.C. voltage (that is, a voltage of an RF (Radio Frequency) signal) that is input from the antenna terminals 1 and 2 when the antenna 13 receives the radio waves, into a D.C. voltage. The shunt circuit 16 generates a power supply voltage Vrect that is regulated so that the D.C. voltage output from the rectifier circuit 15 does not exceed a predetermined upper limit value. The power supply voltage Vrect is a D.C. voltage that is generated based on the radio waves received by the antenna 13, and is supplied by a contactless power transfer from the antenna 13.

The power switching circuit 30 is an example of a circuit that switches an output voltage Vout thereof to a higher one of the power supply voltage Vrect and a power supply voltage Vbat. The power supply voltage Vbat is supplied by the battery 12 that connects to battery terminals 3 and 4, and is supplied by a contact power transfer from the battery 12. The battery terminal 3 connects to a positive polarity terminal of the battery 12, and the battery terminal 4 connects to a negative polarity terminal of the battery 12. The battery terminal 3 may be a Vbat terminal of the semiconductor integrated circuit 14, and the battery terminal 14 may be a VSS terminal of the semiconductor integrated circuit 14. The battery 12 may be provided within the IC tag 11, or may be provided within the electronic apparatus, such as the home appliance.

When performing the contactless communication via the antenna 13, for example, the power switching circuit 30 switches the output voltage Vout thereof to the power supply voltage Vbat having a higher voltage value than the power supply voltage Vrect, in order to assist the power of the power supply voltage Vrect by the power of the power supply voltage Vbat. By assisting the power of the power supply voltage Vrect by the power of the power supply voltage Vbat, it becomes possible to extend a communicable distance between the antenna 13 and the external apparatus, such as the reader and writer.

Figure 2:
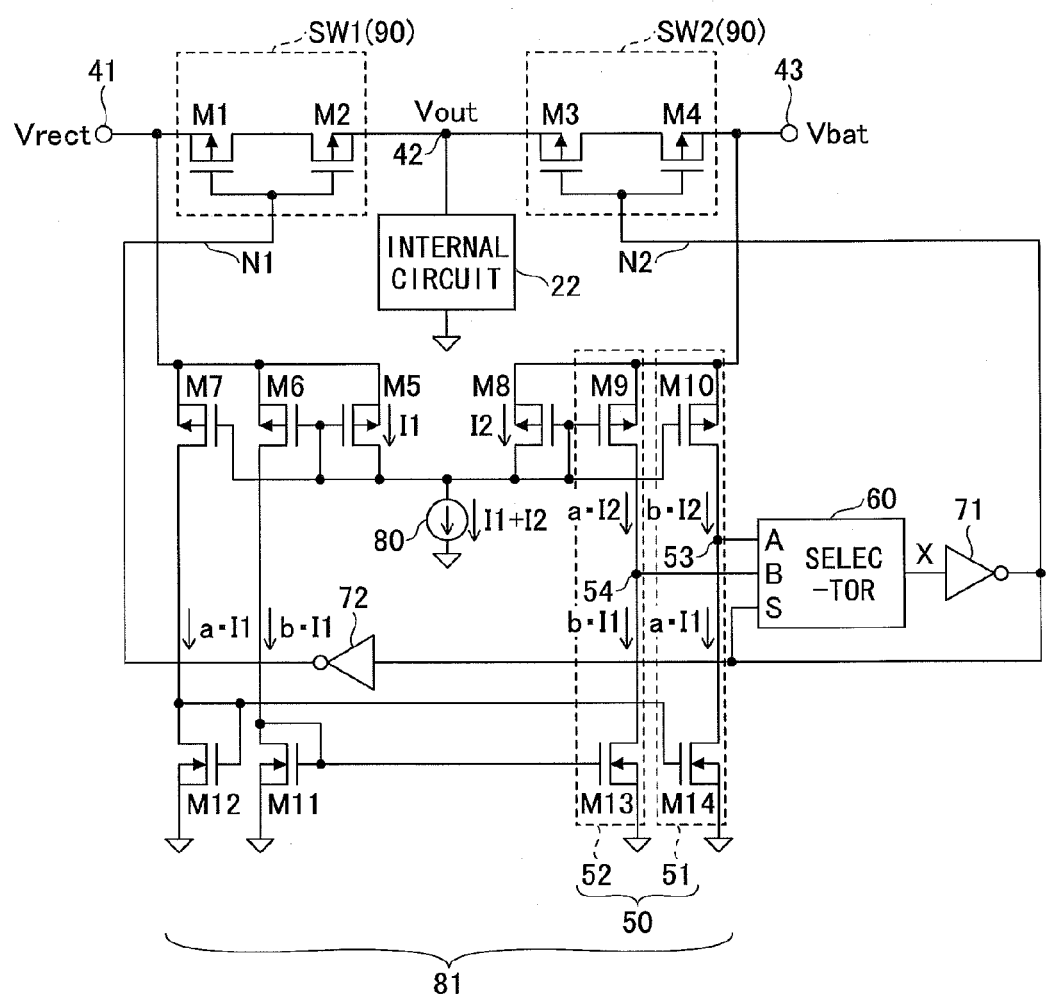
FIG. 2 is a diagram illustrating a configuration of an example of a power switching circuit.

FIG. 2 is a diagram illustrating a configuration of an example of the power switching circuit. FIG. 2 illustrates a power switching circuit 31 that is a first example of the power switching circuit 30. The power switching circuit 31 includes a voltage switching circuit 90, a current mirror circuit 81, a comparator circuit 50, and a selector circuit 60.

The voltage switching circuit 90 is an example of a switching circuit (or switching part) that switches the output voltage Vout that is an example of a supply voltage to be supplied to the internal circuit 22, between the power supply voltage Vrect and the power supply voltage Vbat, based on a comparison result of the comparator circuit 50. The voltage switching circuit 90 switches the output voltage Vout to one of the power supply voltage Vrect and the power supply voltage Vbat, based on the comparison result of the comparator circuit 50.

For example, the voltage switching circuit 90 includes a first power switch SW1 and a second power switch SW2. The power switch SW1 is formed by transistors capable of controlling ON and OFF states of a current path between a first power node 41 to which the power supply voltage Vrect is input and an output node 42 from which the output voltage Vout is output, according to a voltage level at a control node N1, for example. The power switch SW2 is formed by transistors capable of controlling ON and OFF states of a current path between a second power node 43 to which the power supply voltage Vbat is input and the output node 42 from which the output voltage Vout is output, according to a voltage level at a control node N2, for example.

In order to prevent a reverse flow due to a parasitic diode, each of the power switches SW1 and SW2 includes two P-channel type MOS (Metal Oxide Semiconductor) transistors that are back biased in mutually opposite directions. The power switch SW1 includes transistors M1 and M2 that are connected in series and have gates thereof connected in common to the control node N1. The power switch SW2 includes transistors M3 and M4 that are connected in series and have gates thereof connected in common to the control node N2.

The current mirror circuit 81 is an example of a current mirror circuit (or current mirror part) that can transfer monitored currents I1 and I2 obtained by monitoring the plurality of power supply voltages Vrect and Vbat at a plurality of different mirror ratios. The monitored current I1 is an example of a first monitored current flowing through a transistor M5 according to the power supply voltage Vrect that is an example of a first power supply voltage. The monitored current I2 is an example of a second monitored current flowing through a transistor M8 according to the power supply voltage Vbat that is an example of a second power supply voltage.

For example, the current mirror circuit 81 generates a first mirror current a·I1 flowing through a transistor M14, by transferring the monitored current I1 at a first mirror ratio "a", and generates a second mirror current b·I2 flowing through a transistor M10, by transferring the monitored current I2 at a second mirror ratio "b". Similarly, the current mirror circuit 81 generates a third mirror current b·I1 flowing through a transistor M13, by transferring the monitored current I1 at the second mirror ratio "b", and generates a fourth mirror current a·I2 flowing through a transistor M9, by transferring the monitored current I2 at the first mirror ratio "a".

The current mirror circuit 81 includes the transistors M5, M6, M7, M8, M9, and M10 that may be P-channel type MOS transistors, the transistors M11, M12, M13, and M14 that may be N-channel type MOS transistors, and a constant current source 80.

In a case in which the power supply voltage Vrect is supplied to the first power node 41, a current flowing through the transistor M5 that is connected to the first power node 41 is the monitored current I1 that is obtained by monitoring the power supply voltage Vrect. On the other hand, in a case in which the power supply voltage Vbat is supplied to the second power node 43, a current flowing through the transistor M8 that is connected to the second power node 43 is the monitored current I2 that is obtained by monitoring the power supply voltage Vbat.

The constant current source 80 is an example of a constant current circuit that fixes a sum of the monitored current I1 and the monitored current I2 to a predetermined current value. In a case in which the power supply voltage Vrect is higher than the power supply voltage Vbat, the monitored current I1 flowing through the transistor M5 having a diode connection is made higher than the monitored current I2 flowing through the transistor M8 having the diode connection, by the constant current source 80. On the other hand, in a case in which the power supply voltage Vbat is higher than the power supply voltage Vrect, the monitored current I2 flowing through the transistor M8 having the diode connection is made higher than the monitored current I1 flowing through the transistor M5 having the diode connection, by the constant current source 80.

The transistors M11, M12, M13, and M14 have size ratios W/L (channel Width/Length) that are mutually the same. On the other hand, the transistors M5, M6, and M7 have the size ratios W/L that are mutually different, and thus, the monitored current I1 flowing through the transistor M5 can be transferred at a plurality of different mirror ratios by supplying the power supply voltage Vrect to the first power node 41. For example, the transistors M5, M6, and M7 have channel lengths L that are mutually the same, but have channel widths W that are mutually different. Similarly, the transistors M8, M9, and M10 have the size ratios W/L that are mutually different, and thus, the monitored current I2 flowing through the transistor M8 can be transferred at a plurality of different mirror ratios by supplying the power supply voltage Vbat to the second power node 43. For example, the transistors M8, M9, and M10 have channel lengths L that are mutually the same, but have channel widths W that are mutually different.

For example, a ratio of the channel widths $W_5$, $W_6$, $W_7$, $W_8$, $W_9$, and $W_{10}$ of the transistors M5, M6, M7, M8, M9, and M10 is $W_5:W_6:W_7:W_8:W_9:W_{10}=1:b:a:1:a:b$. For example, the value of "a" is greater than that of "b", and both "a" and "b" have values greater than 1.

Accordingly, the current mirror circuit 81 can cause the mirror current a·I1, that is generated by transferring the monitored current I1 at the first mirror ratio "a" by the transistors M5, M7, M12, and M14, to flow through the transistor M14. In addition, the current mirror circuit 81 can cause the mirror current b·I1, that is generated by transferring the monitored current I1 at the second mirror ratio "b" by the transistors M5, M6, M11, and M13, to flow through the transistor M13. Similarly, the current mirror circuit 81 can cause the mirror current b·I2, that is generated by transferring the monitored current I2 at the second mirror ratio "b" by the transistors M8 and M10, to flow through the transistor M10. In addition, the current mirror circuit 81 can cause the mirror current a·I2, that is generated by transferring the monitored current I2 at the first mirror ratio "a" by the transistors M8 and M9, to flow through the transistor M9.

The selector circuit 60 is an example of a selector (or selector part) that selects the mirror currents a·I1, b·I2, b·I1, and a·I2 that are generated and transferred by the current mirror circuit 81, with a combination having different mirror ratios for the monitored currents I1 and I2, according to a switching state of the power supply voltages Vrect and Vbat.

For example, in a case in which the output voltage Vout is switched to the power supply voltage Vrect by the voltage switching circuit 90, the selector circuit 60 selects a combination for which the mirror ratio "a" multiplied to the monitored current I1 is higher than the mirror ratio "b" multiplied to the monitored current I2, that is, a pair of the mirror current a·I1 and the mirror current b·I2. On the other hand, in a case in which the output voltage Vout is switched to the power supply voltage Vbat by the voltage switching circuit 90, the selector circuit 60 selects a combination for which the mirror ratio "a" multiplied to the monitored current I2 is higher than the mirror ratio "b" multiplied to the monitored current I1, that is, a pair of the mirror current a·I2 and the mirror current b·I1.

The comparator circuit 50 is an example of a comparator (or comparator part) that compares the mirror currents included in the combination selected by the selector circuit 60. For example, the comparator circuit 50 includes a first current comparator 51 and a second current comparator 52.

The current comparator 51 is an example of a first comparator (or first comparator part) that compares the mirror current a·I1 and the mirror current b·I2, and judges a magnitude relationship between the mirror current a·I1 and the mirror current b·I2. The current comparator 52 is an example of a second comparator (or second comparator part) that compares the mirror current b·I1 and the mirror current a·I2, and judges the magnitude relationship between the mirror current b·I1 and the mirror current a·I2.

A voltage level at a comparison node 53 where the transistor M14 and the transistor M10 connect, is determined by the magnitude relationship between the mirror current a·I1 and the mirror current b·I2. Accordingly, the current comparator 51 outputs a low-level signal from the comparison node 53 when the mirror current a·I1 is higher than the mirror current b·I2, and outputs a high-level signal from the comparison node 53 when the mirror current b·I2 is higher than the mirror current a·I1.

Similarly, a voltage level at a comparison node 54 where the transistor M13 and the transistor M9 connect, is determined by the magnitude relationship between the mirror current b·I1 and the mirror current a·I2. Accordingly, the current comparator 52 outputs a low-level signal from the comparison node 54 when the mirror current b·I1 is higher than the mirror current a·I2, and outputs a high-level signal from the comparison node 54 when the mirror current a·I2 is higher than the mirror current b·I1.

In a case in which a voltage level at a selection node S is a high level, the selector circuit 60 outputs the voltage level at the comparison node 53 that is connected to an input node A, to an output node X. On the other hand, in a case in which the voltage level at the selection node S is a low level, the selector circuit 60 outputs the voltage level at the comparison node 54 that is connected to an input node B, to the output node X.

Figure 3:
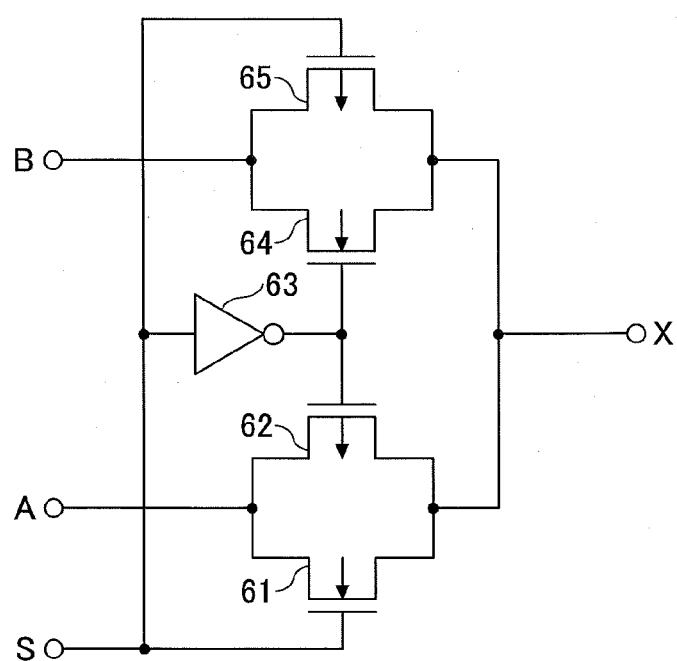
FIG. 3 is a diagram illustrating a configuration of an example of a selector circuit.

FIG. 3 is a diagram illustrating a configuration of an example of the selector circuit. The selector circuit 60 illustrated in FIG. 3 includes a first transfer gate formed by transistors 61 and 62, a second transfer gate formed by transistors 64 and 65, and an inverter 63. The first transfer gate is an example of a switch that switches a connection of the input node A and the output node X between ON and OFF states, by the selection node S and the inverter 63. The second transfer gate is an example of a switch that switches a connection of the input node B and the output node X between ON and OFF states, by the selection node S and the inverter 63.

In FIG. 2, the outputs from the comparison nodes 53 and 54 of the current comparators 51 and 52 are input to an inverter 71 at the output node X via the selector circuit 60. In addition, an output of the inverter 71 is connected to the control node N2, and is also connected to the control node N1 via an inverter 72. The voltage levels at the control nodes N1 and N2 are sharply varied by the inverters 71 and 72, and the logic levels at the control nodes N1 and N2 become mutually opposite. Hence, it is possible to virtually eliminate a time in which the ON states of the power switches SW1 and SW2 overlap, and reverse currents from the output node 42 to the power nodes 41 and 43 can be prevented.

The selection node S of the selector circuit 60 is connected to the control node N2 at the same logic level, and is connected to the control node N1 at an opposite logic level. Accordingly, in a case in which the power switch SW1 is ON due to the low level at the control node N1, that is, in a case in which the power switch SW2 is OFF due to the high level at the control node N2, the voltage level at the comparison node 53 is output from the output node X. On the other hand, in a case in which the power switch SW1 is OFF due to the high level at the control node N1, that is, in a case in which the power switch SW2 is ON due to the low level at the control node N2, the voltage level at the comparison node 54 is output from the output node X.

Figure 4:
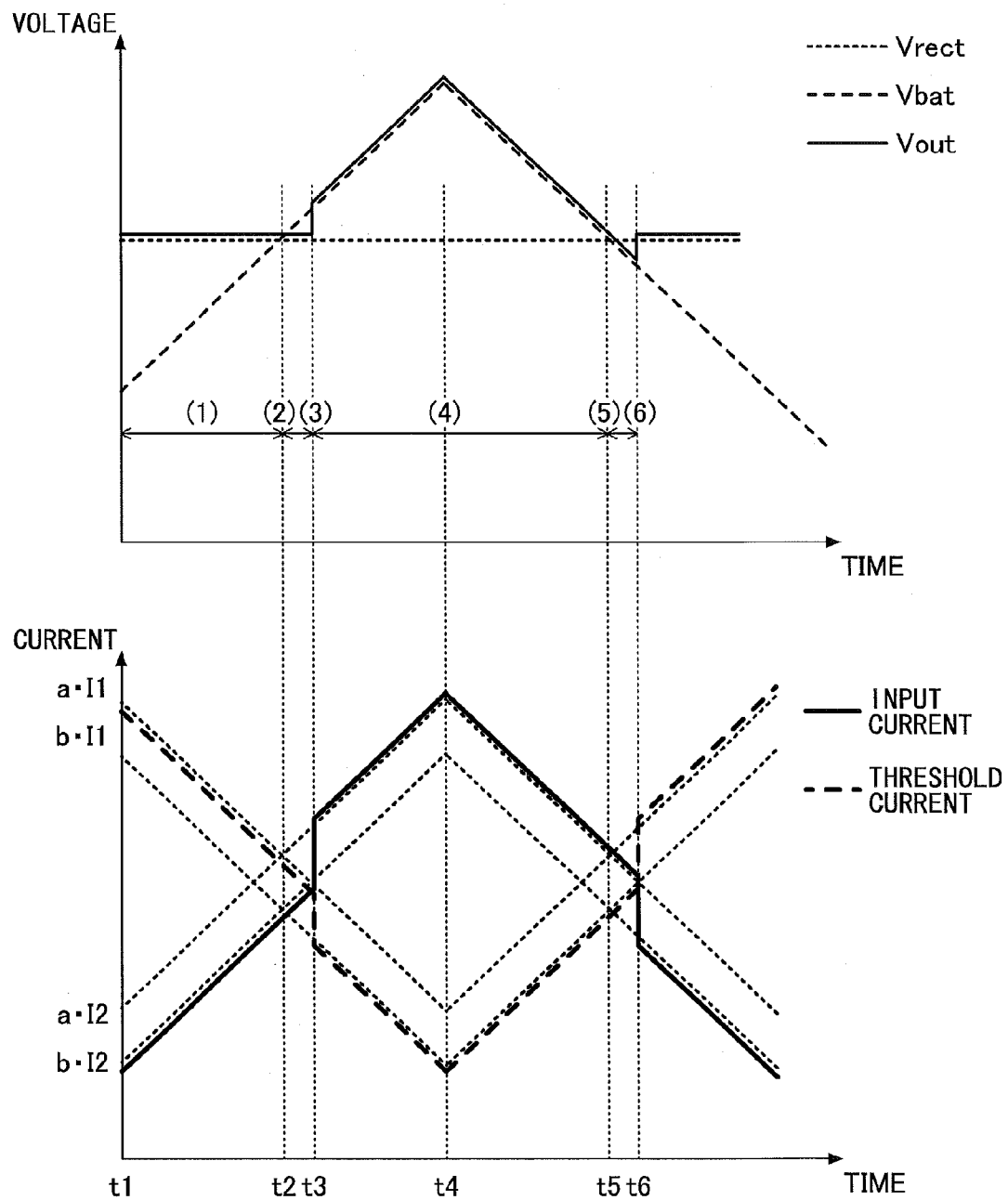
FIG. 4 is a diagram for explaining an example of a hysteresis operation.

FIG. 4 is a diagram for explaining an example of a hysteresis operation that is achieved by the power switching method performed by the power switching circuit 31. An upper part of FIG. 4 illustrates voltages, and a lower part of FIG. 4 illustrates currents. The operation illustrated in FIG. 4 will be described with reference to FIG. 2. In FIG. 4, "input current" represents an input current of the comparator circuit 50, corresponding to the mirror current b·I2 or the mirror current a·I2. In addition, "threshold current" represents a threshold current of the comparator circuit 50, corresponding to the mirror current a·I1 or the mirror current b·I1.

(1) Case in which Vrect is Sufficiently Higher than Vbat:

This case corresponds to a time interval t1-t2 from a time (or timing) t1 to a time (or timing) t2 illustrated in FIG. 4. When Vrect>Vbat, I1>I2, and "a" and "b" are set to satisfy a>b. Accordingly, in the current comparator 51, (input current)−(threshold current)=(b·I2)−(a·I1)<0. Hence, the control node N1 is at low level, the control node N2 is at high level, the power switch SW1 is ON, and the power switch SW2 is OFF.

(2) Case in which Vbat Increases (or Vrect Decreases) and Vrect=Vbat:

This case corresponds to a timing t2 illustrated in FIG. 4. When Vrect=Vbat, I1=I2, and "a" and "b" are set to satisfy a>b. Accordingly, in the current comparator 51, (input current)−(threshold current)=(b·I2)−(a·I1)<0. Hence, the control node N1 remains at low level, the control node N2 remains at high level, the power switch SW1 remains ON, and the power switch SW2 remains OFF.

(3) Case in which Vbat Further Increases (or Vrect Further Decreases) and Vrect<Vbat:

This case corresponds to a timing t3 illustrated in FIG. 4. When Vrect<Vbat, I1<I2, and "a" and "b" are set to satisfy a>b. In the current comparator 51, when (input current)−(threshold current)=(b·I2)−(a·I1)=0, that is, I2=a/b·I1, the control node N1 switches to a high-level state, the control node N2 switches to a low-level state, the power switch SW1 switches to an OFF state, the power switch SW2 switches to an ON state, and the current comparator 52 is selected by the selector circuit 60.

In other words, when the mirror current a·I1 and the mirror current b·I2 match due to the decrease of the mirror current a·I1 or the increase of the mirror current b·I2, the voltage switching circuit 90 switches the output voltage Vout thereof from the power supply voltage Vrect to the power supply voltage Vbat. When the current comparator 51 detects the matching of the mirror current a·I1 and the mirror current b·I2, for example, the voltage switching circuit 90 turns the power switch SW1 OFF and turns the power switch SW2 ON, in order to switch the output voltage Vout to the power supply voltage Vbat having a higher voltage value than the power supply voltage Vrect.

(4) Case in which Vbat is Sufficiently Higher than Vrect:

This case corresponds to a time interval t3-t4 and a time interval t4-t5. When Vrect<Vbat, I1<I2, and "a" and "b" are set to satisfy a>b. Accordingly, in the current comparator 52, (input current)−(threshold current)=(a·I2)−(b·I1)>0. Hence, the control node N1 remains at high level, the control node N2 remains at low level, the power switch SW1 remains OFF, and the power switch SW2 remains ON.

(5) Case in which Vbat Decreases (or Vrect Increases) and Vrect=Vbat:

This case corresponds to a timing t5. When Vrect=Vbat, I1=I2, and "a" and "b" are set to satisfy a>b. Accordingly, in the current comparator 52, (input current)−(threshold current)=(a·I2)−(b·I1)>0. Hence, the control node N1 remains at high level, the control node N2 remains at low level, the power switch SW1 remains OFF, and the power switch SW2 remains ON.

(6) Case in which Vbat Further Decreases (or Vrect Further Increases) and Vrect>Vbat:

This case corresponds to a timing t6. When Vrect>Vbat, I1>I2, and "a" and "b" are set to satisfy a>b. Accordingly, in the current comparator 52, when (input current)−(threshold current)=(a·I2)−(b·I1)=0, that is, I2=b/a·I1, the control node N1 switches to a low-level state, the control node N2 switches to a high-level state, the power switch SW1 switches to an ON state, the power switch SW2 switches to an OFF state, and the current comparator 51 is selected by the selector circuit 60.

In other words, when the mirror current b·I1 and the mirror current a·I2 match due to the increase of the mirror current b·I1 or the decrease of the mirror current a·I2, the voltage switching circuit 90 switches the output voltage Vout thereof from the power supply voltage Vbat to the power supply voltage Vrect. When the current comparator 52 detects the matching of the mirror current b·I1 and the mirror current a·I2, for example, the voltage switching circuit 90 turns the power switch SW1 ON and turns the power switch SW2 OFF in order to switch the output voltage Vout to the power supply voltage Vrect having a higher voltage value than the power supply voltage Vbat.

Figure 5:
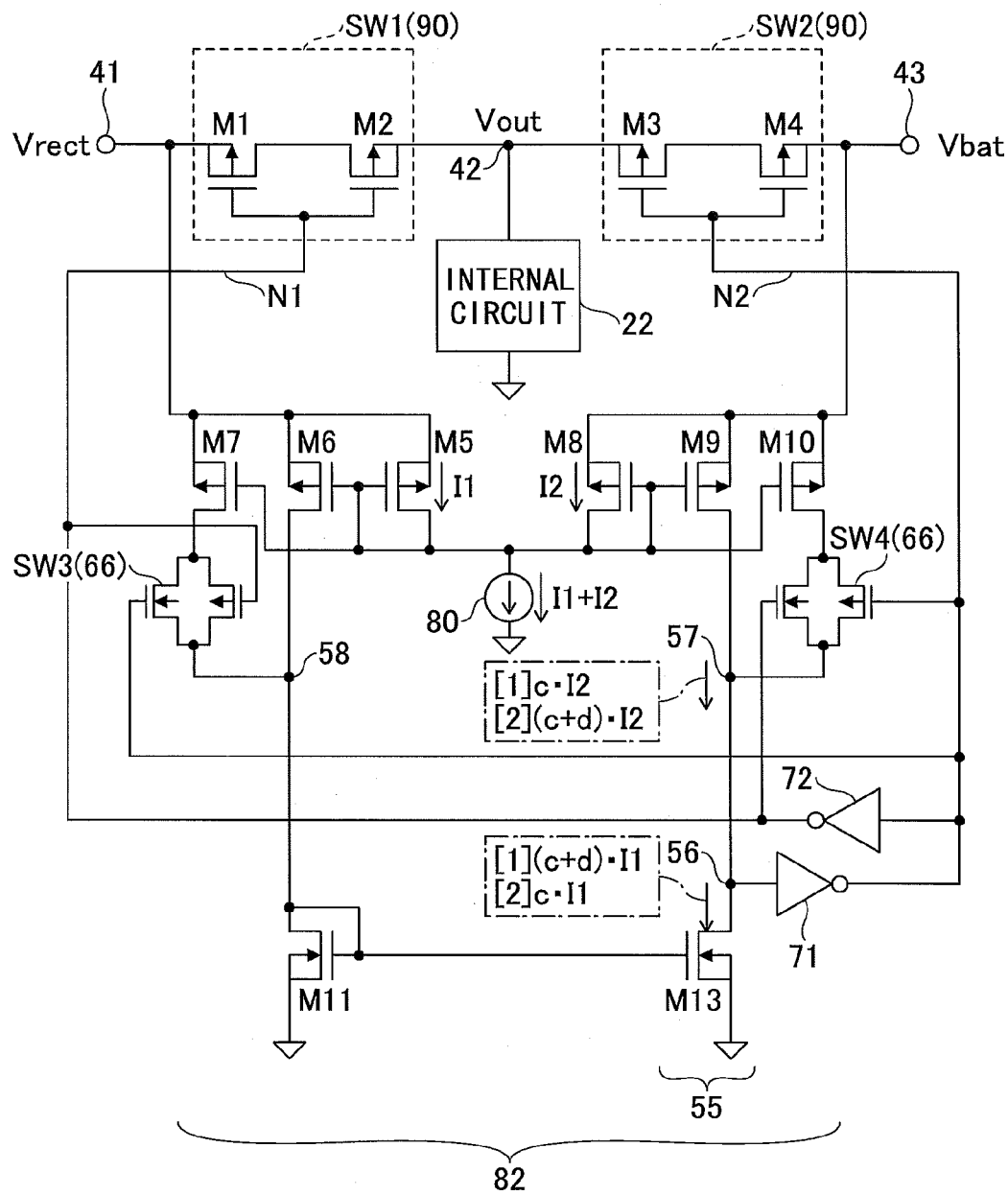
FIG. 5 is a diagram illustrating a configuration of another example of the power switching circuit.

FIG. 5 is a diagram illustrating a configuration of another example of the power switching circuit. FIG. 5 illustrates a power switching circuit 32 that is a second example of the power switching circuit 30. In FIG. 5, those parts that are the same as those corresponding parts in FIG. 2 are designated by the same reference numerals, and a description thereof, including the description of the configuration and effects achieved thereby, will be omitted. The power switching circuit 32 includes the voltage switching circuit 90, a current mirror circuit 82, a comparator circuit 55, and a selector circuit 66.

The current mirror circuit 82 is an example of a current mirror circuit (or current mirror part) that can transfer monitored currents I1 and I2 obtained by monitoring the plurality of power supply voltages Vrect and Vbat at a plurality of different mirror ratios.

For example, the current mirror circuit 82 generates a first mirror current (c+d)·I1 flowing through the transistor M13, by transferring the monitored current I1 at a first mirror ratio "c+d", and generates a second mirror current c·I2 flowing through a node 57, by transferring the monitored current I2 at a second mirror ratio "c". Similarly, the current mirror circuit 82 generates a third mirror current c·I1 flowing through the transistor M13, by transferring the monitored current I1 at the second mirror ratio "c", and generates a fourth mirror current (c+d)·I2 flowing through the node 57, by transferring the monitored current I2 at the first mirror ratio "(c+d)".

For example, a ratio of the channel widths $W_5/W_6$, $W_7$, $W_8$, $W_9$, and $W_{10}$ of the transistors M5, M6, M7, M8, M9, and M10 is $W_5:W_6:W_7:W_8:W_9:W_{10}=1:c:d:1:c:d$. For example, the value of "d" is greater than that of "c", and both "c" and "d" have values greater than 1.

Accordingly, when a switch SW3 is ON, the current mirror circuit 82 can cause the mirror current (c+d)·I1, that is generated by transferring the monitored current I1 at the first mirror ratio "c+d" by the transistors M5, M6, M7, M11, and M13, to flow through the transistor M13. In addition, when a switch SW4 is OFF, the current mirror circuit 82 can cause the mirror current c·I2, that is generated by transferring the monitored current I2 at the second mirror ratio "c" by the transistors M8 and M9, to flow through the node 57. Similarly, when the switch SW3 is OFF, the current mirror circuit 82 can cause the mirror current c·I1, that is generated by transferring the monitored current I1 at the second mirror ratio "c" by the transistors M5, M6, M11, and M13, to flow through the transistor M13. In addition, when the switch SW4 is ON, the current mirror circuit 82 can cause the mirror current (c+d)·I2, that is generated by transferring the monitored current I2 at the first mirror ratio "c+d" by the transistors M8, M9, and M10, to flow through the node 57.

The node 57 connects the transistor M9 and the transistor M10 via the switch SW4. The current flowing through the node 57 is equal to the current flowing through the transistor M9 when the switch SW4 is OFF, and is equal to a sum of the currents flowing through the transistor M9 and the transistor M10 when the switch SW4 is ON.

A node 58 connects the transistor M6 and the transistor M7 via the switch SW3. The current flowing though the node 58 is equal to the current flowing through the transistor M6 when the switch SW3 is OFF, and is equal to a sum of the currents flowing through the transistor M6 and the transistor M7 when the switch SW3 is ON.

The selector circuit 66 is an example of a selector (or selector part) that selects the mirror currents (c+d)·I1, c·I2, c·I1, and (c+d)·I2 that are generated and transferred by the current mirror circuit 82, with a combination having different mirror ratios for the monitored currents I1 and I2, according to a switching state of the power supply voltages Vrect and Vbat.

For example, in a case in which the output voltage Vout is switched to the power supply voltage Vrect by the voltage switching circuit 90, the selector circuit 66 selects a combination for which the mirror ratio "c+d" multiplied to the monitored current I1 is higher than the mirror ratio "c" multiplied to the monitored current I2, that is, a pair of the mirror current (c+d)·I1 and the mirror current c·I2. On the other hand, in a case in which the output voltage Vout is switched to the power supply voltage Vbat by the voltage switching circuit 90, the selector circuit 66 selects a combination for which the mirror ratio "c+d" multiplied to the monitored current I2 is higher than the mirror ratio "c" multiplied to the monitored current I1, that is, a pair of the mirror current (c+d)·I2 and the mirror current c·I1.

The comparator circuit 55 is an example of a comparator (or comparator part) that compares the mirror currents included in the combination selected by the selector circuit 66. For example, the comparator circuit 55 switches between comparing the first mirror current (c+d)·I1 and the second mirror current c·I2, and comparing the third mirror current c·I1 and the fourth mirror current (c+d)·I2, according to the selection made by the selector circuit 66.

A voltage level at a comparison node 56 where the transistor M13 and the node 57 connect, is determined by the magnitude relationship between the mirror current flowing through the transistor M13 and the mirror current flowing through the node 57. Accordingly, the comparator circuit 55 outputs a low-level signal from the comparison node 56 when the mirror current (c+d)·I1 is higher than the mirror current c·I2, and outputs a high-level signal from the comparison node 56 when the mirror current c·I2 is higher than the mirror current (c+d)·I1. Similarly, the comparator circuit 55 outputs a low-level signal from the comparison node 56 when the mirror current c·I1 is higher than the mirror current (c+d)·I2, and outputs a high-level signal from the comparison node 56 when the mirror current (c+d)·I2 is higher than the mirror current c·I1.

For example, the selector circuit 66 includes the switch SW3 formed by the first transfer gate, and the switch SW4 formed by the second transfer gate.

An output from the comparison node 56 of the comparator circuit 55 is input to the inverter 71. In addition, the output of the inverter 71 is connected to the control node N2, and is also connected to the control node N1 via the inverter 72. In addition, the output of the inverter 71 is connected to one gate of each of the switches SW3 and SW4, and the output of the inverter 72 is connected to the other gate of each of the switches SW3 and SW4. The voltage levels at the control nodes N1 and N2 are sharply varied by the inverters 71 and 72, and the logic levels at the control nodes N1 and N2 become mutually opposite. Hence, it is possible to virtually eliminate the time in which the ON states of the power switches SW1 and SW2 overlap, and reverse currents from the output node 42 to the power nodes 41 and 43 can be prevented.

Figure 6:
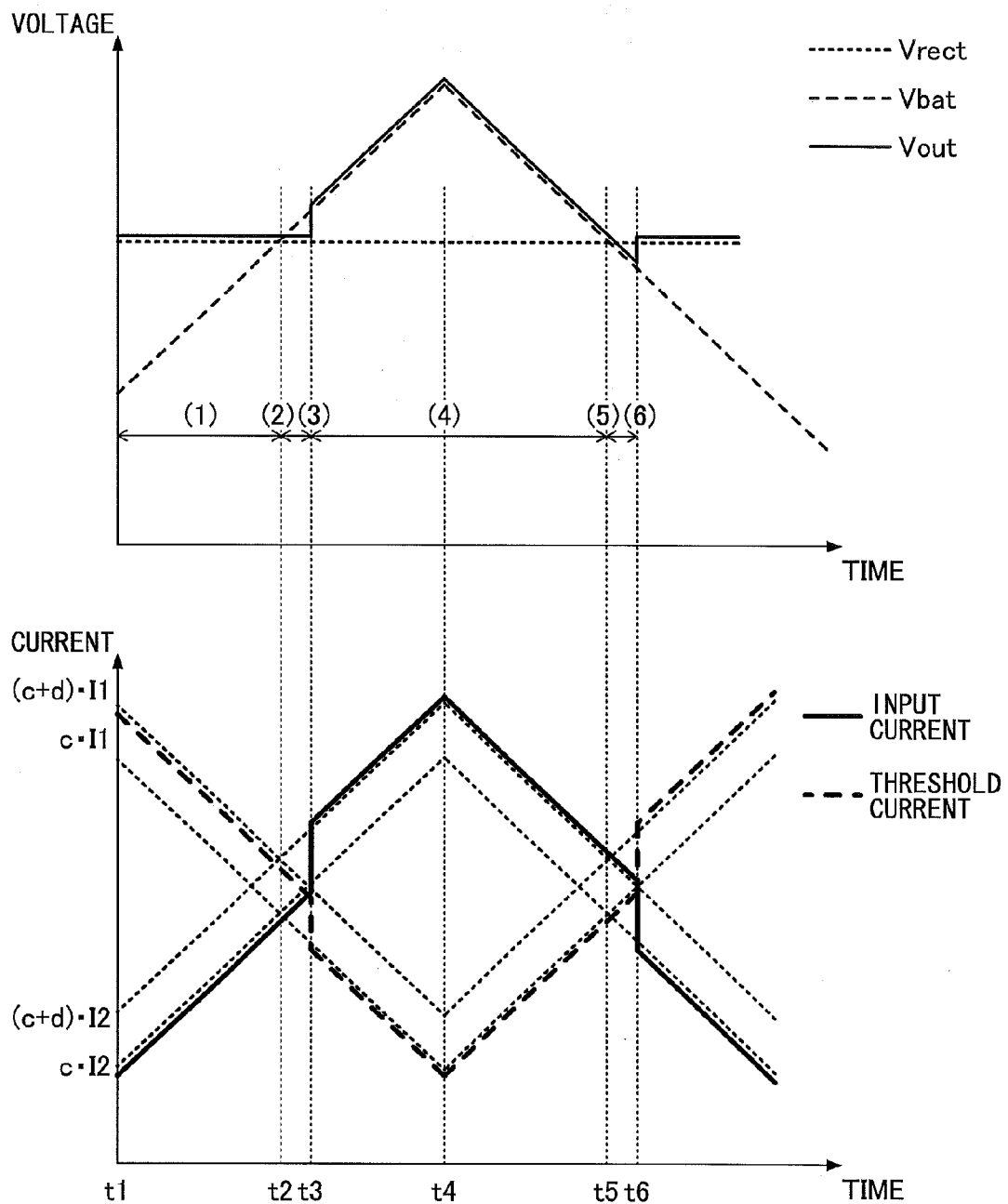
FIG. 6 is a diagram for explaining an example of the hysteresis operation.

FIG. 6 is a diagram for explaining an example of the hysteresis operation that is achieved by the power switching method performed by the power switching circuit 32. The operation illustrated in FIG. 6 will be described with reference to FIG. 5. In FIG. 6, "input current" represents an input current of the comparator circuit 55, corresponding to the mirror current c·I2 or the mirror current (c+d)·I2. In addition, "threshold current" represents a threshold current of the comparator circuit 55, corresponding to the mirror current (c+d)·I1 or the mirror current c·I1. In FIG. 6, those parts that are the same as those corresponding parts in FIG. 4 are designated by the same reference numerals, and a description thereof will be omitted.

When the mirror current (c+d)·I1 and the mirror current c·I2 match due to the decrease of the mirror current (c+d)·I1 or the increase of the mirror current c·I2, the voltage switching circuit 90 switches the output voltage Vout thereof from the power supply voltage Vrect to the power supply voltage Vbat. On the other hand, when the mirror current c·I1 and the mirror current (c+d)·I2 match due to the increase of the mirror current c·I1 or the decrease of the mirror current (c+d)·I2, the voltage switching circuit 90 switches the output voltage Vout thereof from the power supply voltage Vbat to the power supply voltage Vrect.

Accordingly, in each of the embodiments described above, when switching the output voltage Vout to the higher one of the power supply voltage Vrect and the power supply voltage Vbat, the power switching circuit 90 changes the mirror ratio in order to introduce hysteresis to the magnitude comparison of the mirror currents. Hence, the power switching can be stabilized, and a chattering in which the switching frequently occurs between the power supply voltage Vrect and the power supply voltage Vbat can be suppressed. In addition, even when the power supply voltage Vrect varies when the radio waves are transmitted or received via the antenna 13, the chattering in which the switching frequently occurs between the power supply voltage Vrect and the power supply voltage Vbat can be suppressed because the power switching is performed with the hysteresis. Furthermore, generation of noise in the output voltage Vout due to the chattering can be suppressed, and an erroneous operation of the internal circuit 22 due to the noise in the output voltage Vout can also be suppressed.

In the case of this embodiment which detects the change in the power supply voltage from the change in the current, the amount of change in the current with respect to the amount of change in the power supply voltage can be designed to be relatively large. For this reason, even when the current detection accuracy becomes slightly inconsistent, the power switching can be stabilized when compared to the case in which the change in the current is detected from the voltage-divided voltage using the resistor voltage divider.

In this embodiment which forms the circuit using the transistors in place of resistor elements of the resistor voltage divider, the circuit can be formed within a relatively small circuit area, and a current consumption can be suppressed. In addition, it is possible to reduce both the power consumption and the cost of the circuit, and the power switching can be performed with the hysteresis.

In each of the embodiments, the number of switchable power supplies is not limited to two, and may be three or more. In addition, the switchable power supply voltages may be D.C. voltages supplied by contact power transfer, or D.C. voltages supplied by contactless power transfer.

According to each of the embodiments, the power switching can be stabilized. Further, a low power consumption and a low cost can be achieved, in addition to stabilizing the switching of the power supplies.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A power switching circuit comprising:
   a current mirror circuit configured to generate a plurality of mirror currents, by transferring, at different mirror ratios, a plurality of monitored currents that are obtained by monitoring a plurality of power supply voltages;
   a selector configured to select the plurality of mirror currents by a combination of the different mirror ratios at which the plurality of monitored currents are transferred, according to a switching state of the plurality of power supply voltages;
   a comparator, included in the current mirror circuit, and configured to compare the plurality of mirror currents selected by the selector, and output a comparison result; and
   a switching circuit configured to switch a supply voltage to be supplied to a load to one of the plurality of power supply voltages, based on the comparison result.

2. The power switching circuit as claimed in claim 1, wherein the current mirror circuit transfers, at the different mirror ratios, a first monitored current that is obtained by monitoring a first power supply voltage amongst the plurality of power supply voltages, and a second monitored current that is obtained by monitoring a second power supply voltage, different from the first power supply voltage, amongst the plurality of power supply voltages, and
wherein the comparator, in a case in which the supply voltage is switched to the first power supply voltage by the switching circuit, compares the mirror currents selected by the selector according to a first combination in which the mirror ratio of the first monitored current is higher than the mirror ratio of the second monitored current, and in a case in which the supply voltage is switched to the second power supply voltage by the switching circuit, compares the mirror currents selected by the selector according to a second combination in which the mirror ratio of the second monitored current is higher than the mirror ratio of the first monitored current.

3. The power switching circuit as claimed in claim 2, wherein the switching circuit, in a case in which the mirror currents selected by the selector according to the first combination match, switches the supply voltage from the first power supply voltage to the second power supply voltage, and in a case in which the mirror currents selected by the selector according to the second combination match, switches the supply voltage from the second power supply voltage to the first power supply voltage.

4. The power switching circuit as claimed in claim 3, wherein the comparator, in a case in which the mirror currents selected by the selector according to the first combination match, switches from comparing the mirror currents selected by the selector according to the first combination to comparing the mirror currents selected by the selector according to the second combination, and in a case in which the mirror currents selected by the selector according to the second combination match, switches from comparing the mirror currents selected by the selector according to the second combination to comparing the mirror currents selected by the selector according to the first combination.

5. The power switching circuit as claimed in claim 1, wherein the switching circuit switches the supply voltage to one of the plurality of power supply voltages when the mirror currents compared in the comparator match.

6. The power switching circuit as claimed in claim 1,
wherein the current mirror circuit transfers, at the different mirror ratios, a first monitored current that is obtained by monitoring a first power supply voltage amongst the plurality of power supply voltages, and a second monitored current that is obtained by monitoring a second power supply voltage, different from the first power supply voltage, amongst the plurality of power supply voltages, and
wherein the comparator includes:
 a first comparator configured to compare a first mirror current that is generated by transferring the first monitored current at a first mirror ratio, and a second mirror current that is generated by transferring the second monitored current at a second mirror ratio lower than the first mirror ratio, and
 a second comparator configured to compare a third mirror current that is generated by transferring the first monitored current at the second mirror ratio, and a fourth mirror current that is generated by transferring the second monitored current at the first mirror ratio.

7. The power switching circuit as claimed in claim 1,
wherein the current mirror circuit transfers, at the different mirror ratios, a first monitored current that is obtained by monitoring a first power supply voltage amongst the plurality of power supply voltages, and a second monitored current that is obtained by monitoring a second power supply voltage, different from the first power supply voltage, amongst the plurality of power supply voltages, and
wherein the comparator switches between comparing a first mirror current that is generated by transferring the first monitored current at a first mirror ratio, and a second mirror current that is generated by transferring the second monitored current at a second mirror ratio lower than the first mirror ratio, and comparing a third mirror current that is generated by transferring the first monitored current at the second mirror ratio, and a fourth mirror current that is generated by transferring the second monitored current at the first mirror ratio, according to the mirror currents selected by the selector.

8. A semiconductor integrated circuit comprising:
a current mirror circuit configured to generate a plurality of mirror currents, by transferring, at different mirror ratios, a plurality of monitored currents that are obtained by monitoring a plurality of power supply voltages;
a selector configured to select the plurality of mirror currents by a combination of the different mirror ratios at which the plurality of monitored currents are transferred, according to a switching state of the plurality of power supply voltages;
a comparator, included in the current mirror circuit, and configured to compare the plurality of mirror currents selected by the selector, and output a comparison result;
an electronic circuit; and
a switching circuit configured to switch a supply voltage to be supplied to the electronic circuit to one of the plurality of power supply voltages, based on the comparison result.

9. The semiconductor integrated circuit as claimed in claim 8,
wherein at least one of the plurality of power supply voltages is a D.C. voltage that is generated based on received radio waves, and
wherein the electronic circuit includes a demodulating circuit configured to demodulate the received radio waves.

10. A radio apparatus comprising:
an antenna;
a current mirror circuit configured to generate a plurality of mirror currents, by transferring, at different mirror ratios, a plurality of monitored currents that are obtained by monitoring a plurality of power supply voltages;
a selector configured to select the plurality of mirror currents by a combination of the different mirror ratios at which the plurality of monitored currents are transferred, according to a switching state of the plurality of power supply voltages;
a comparator, included in the current mirror circuit, and configured to compare the plurality of mirror currents selected by the selector, and output a comparison result;
an electronic circuit; and
a switching circuit configured to switch a supply voltage to be supplied to the electronic circuit to one of the plurality of power supply voltages, based on the comparison result,
wherein at least one of the plurality of power supply voltages is a D.C. voltage that is generated based on received radio waves, and
wherein the electronic circuit includes a demodulating circuit configured to demodulate the received radio waves.

11. A radio system comprising:
an antenna;
a battery;
a current mirror circuit configured to generate a plurality of mirror currents, by transferring, at different mirror ratios, a plurality of monitored currents that are obtained by monitoring a plurality of power supply voltages;
a selector configured to select the plurality of mirror currents by a combination of the different mirror ratios at which the plurality of monitored currents are transferred, according to a switching state of the plurality of power supply voltages;
a comparator, included in the current mirror circuit, and configured to compare the plurality of mirror currents selected by the selector, and output a comparison result;
an electronic circuit; and
a switching circuit configured to switch a supply voltage to be supplied to the electronic circuit to one of the plurality of power supply voltages, based on the comparison result,
wherein at least one of the plurality of power supply voltages is a D.C. voltage that is generated based on radio waves received by the antenna,
wherein another one of the plurality of power supply voltages is a D.C. voltage that is supplied from the battery, and wherein the electronic circuit includes a demodulating circuit configured to demodulate the radio waves.

12. A power switching method comprising:

switching a supply voltage to be supplied to a load from a first power supply voltage to a second power supply voltage that is different from the first power supply voltage, when a match of a first mirror current that is generated by transferring a first monitored current obtained by monitoring the first power supply voltage at a first mirror ratio, and a second mirror current that is generated by transferring a second monitored current obtained by monitoring the second power supply voltage at a second mirror ratio lower than the first mirror ratio, is detected due to one of a decrease of the first mirror current and an increase of the second mirror current; and switching the supply voltage from the second power supply voltage to the first power supply voltage, when a match of a third mirror current that is generated by transferring the first monitored current at the second mirror ratio, and a fourth mirror current that is generated by transferring the second monitored current at the first mirror ratio, is detected due to one of an increase of the third mirror current and a decrease of the fourth mirror current.

13. The power switching method as claimed in claim 12, further comprising:

switching from comparing the first mirror current and the second mirror current to comparing the third mirror current and the fourth mirror current, when the match of the first mirror current and the second mirror current is detected due to the one of the decrease of the first mirror current and the increase of the second mirror current; and switching from comparing the third mirror current and the fourth mirror current to comparing the first mirror current and the second mirror current, when the match of the third mirror current and the fourth mirror current is detected due to the one of the increase of the third mirror current and the decrease of the fourth mirror current.

14. The power switching method as claimed in claim 12, wherein the first power supply voltage is a D.C. voltage that is generated based on received radio waves, and the second power supply voltage is a D.C. voltage supplied from a battery.

* * * * *